(12) United States Patent
Feldle et al.

(10) Patent No.: US 8,971,056 B2
(45) Date of Patent: Mar. 3, 2015

(54) HERMETICALLY SEALED RADIO-FREQUENCY FRONT END

(75) Inventors: Heinz-Peter Feldle, Senden (DE); Bernhardt Schoenlinner, Sauerlach (DE); Ulrich Prechtel, Munich (DE); Joerg Sander, Ulm (DE)

(73) Assignee: EADS Deutschland GmbH, Ottobrunn (DE)

( * ) Notice: Subject to any disclaimer, the term of this patent is extended or adjusted under 35 U.S.C. 154(b) by 174 days.

(21) Appl. No.: 13/500,674

(22) PCT Filed: Sep. 18, 2010

(86) PCT No.: PCT/DE2010/001105
§ 371 (c)(1),
(2), (4) Date: May 25, 2012

(87) PCT Pub. No.: WO2011/042000
PCT Pub. Date: Apr. 14, 2011

(65) Prior Publication Data
US 2012/0236513 A1 Sep. 20, 2012

(30) Foreign Application Priority Data
Oct. 9, 2009 (DE) .................. 10 2009 048 838

(51) Int. Cl.
*H01R 12/16* (2006.01)
*G01S 7/03* (2006.01)
*H01L 23/10* (2006.01)

(52) U.S. Cl.
CPC .............. *G01S 7/032* (2013.01); *H01L 23/10* (2013.01); *H01L 2924/0002* (2013.01)
USPC ............ 361/790; 361/770; 361/784; 361/803

(58) Field of Classification Search
USPC .................... 361/767, 792, 770–790, 803; 174/252–256
See application file for complete search history.

(56) References Cited

U.S. PATENT DOCUMENTS

| 3,403,300 | A | | 9/1968 | Horowitz et al. | |
|---|---|---|---|---|---|
| 5,295,044 | A | * | 3/1994 | Araki et al. | 361/709 |
| 5,311,402 | A | | 5/1994 | Kobayashi et al. | |
| 5,434,745 | A | * | 7/1995 | Shokrgozar et al. | 361/735 |
| 6,185,107 | B1 | * | 2/2001 | Wen | 361/803 |

(Continued)

FOREIGN PATENT DOCUMENTS

| EP | 1 328 042 A1 | 7/2003 |
|---|---|---|
| JP | 5-226487 A | 9/1993 |
| JP | 2000-208654 A | 7/2000 |
| JP | 2003-68907 A | 3/2003 |
| JP | 2004-28980 A | 1/2004 |
| JP | 2007-202130 A | 8/2007 |
| WO | WO 81/00949 A1 | 4/1981 |

OTHER PUBLICATIONS

International Search Report including English translation dated Feb. 4, 2011 (Six (6) pages).
English translation of Japanese Office Action dated Jan. 28, 2014 (three (3) pages).

*Primary Examiner* — Tuan T Dinh
(74) *Attorney, Agent, or Firm* — Crowell & Moring LLP

(57) ABSTRACT

A hermetically sealed HF front end (e.g. a transmission/reception module) in a multilayer structure that includes electronic components is provided. The multilayer structure contains a plurality of substrates stacked one above the other and carrying the components. Grooves are formed in the substrates and sealing elements are provided between the substrates, which sealing elements engage in the grooves, and the substrates are soldered together.

19 Claims, 2 Drawing Sheets

(56) References Cited

U.S. PATENT DOCUMENTS

Figure 1:
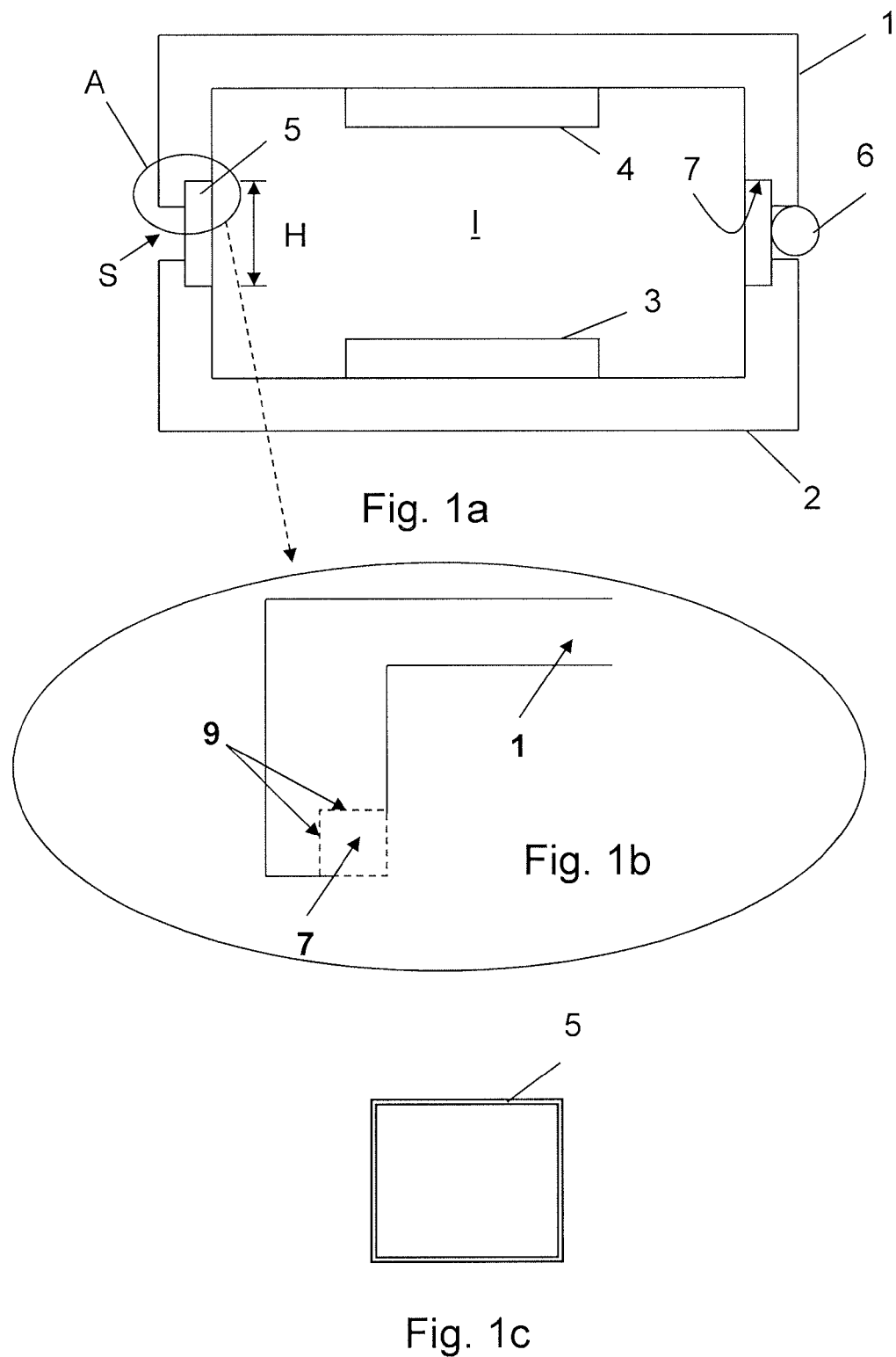

| | | |
|---|---|---|
| 6,218,730 B1 | 4/2001 | Toy et al. |
| 6,933,537 B2 * | 8/2005 | Yee et al. .................. 257/99 |
| 7,086,134 B2 * | 8/2006 | Dautartas et al. .............. 29/464 |
| 7,829,991 B2 * | 11/2010 | Moden et al. .................. 257/686 |
| 8,093,505 B2 * | 1/2012 | Gokan et al. .................. 174/258 |
| 2003/0062533 A1 | 4/2003 | Yee et al. |
| 2003/0218566 A1 | 11/2003 | Feldle et al. |
| 2007/0170565 A1 | 7/2007 | Hong et al. |

* cited by examiner

HERMETICALLY SEALED RADIO-FREQUENCY FRONT END

BACKGROUND AND SUMMARY OF THE INVENTION

Exemplary embodiments of the present invention relate to a high frequency (HF) front end in a multilayer structure. This HF front end is designed for use as a transmission/reception module, transmission module or reception module.

The present invention can be used, inter alia, in active antennas (active electronically steerable antennas AESA) in radar systems, SAR (synthetic aperture radar), electronic warfare (EW) or operations command systems, as well as for navigation and communications systems. Possible platforms are ground and marine systems, aircraft, satellites, drones and missiles as well as building-based or vehicle-based systems. The multilayer structure of these modules allows for a high degree of miniaturization of the modules, as well as their arrangement in conformal and/or structurally integrated antenna arrays.

European Patent Publication No. EP 1 328 042 B1 discloses a transmission/reception module for a radar system that consists of several substrate layers stacked one above the other, which are joined by solder balls. Because of the finite extent of the solder balls, gaps remain between adjacent substrate layers. Moisture and other contaminants can penetrate into the interior of the module through these gaps, which can influence the electrical function of the individual components, e.g., electrical components, within the module or even damage them to the extent of total failure. Despite the solder connection between the individual layers described in EP 1 328 042 B1, hermetic sealing of the interior of the module is not guaranteed. This hermetic sealing is, however, required for using these modules for space travel applications and platforms in critical ambient conditions.

PCT Publication No. WO81/00949 describes a semiconducting component package comprising a chip carrier, wherein the chip carrier is constructed from a plurality of layers of insulating material. These layers comprise metallic grooves at their edges, with which electrical contact can be made with adjacent layers.

U.S. Pat. No. 5,311,402 discloses a semiconducting arrangement, wherein an integrated circuit is attached to a circuit board and a cover is provided for hermetic sealing.

U.S. Pat. No. 3,403,300 discloses a stack of circuit boards.

Protection against ambient influences is possible using external measures, such as additional welded protective casings, which increase the cross-sectional dimensions of the transmission/reception modules. In addition, mechanical forces act on the multilayer structure due to the deformation of such protective casings during welding, which influences the long-term stability of the modules or can break the solder joints between the module layers. In addition, such protective casings, e.g., of plastic (e.g., polymers), provide only limited sealing, but not hermetic sealing. Furthermore, such plastics can degas over time and thus damage the components and their joints to the substrates.

Exemplary embodiments of the present invention provide a generic HF front end (e.g., transmission/reception module with integrated radiator element) with a hermetically sealed interior space.

The HF front end according to the invention is implemented in a multilayer structure and comprises electronic components, wherein the multilayer structure contains a plurality of substrates stacked one above the other and carrying the components. The module includes grooves formed in the substrates (at the edge regions of the respective layer structure) and sealing elements (e.g. metallic frames or covers) are provided between the substrates for the purpose of hermetic sealing and are deployed within the grooves, whereby the sealing elements engage in grooves of adjacent substrates. According to the invention, adjacent substrates are soldered together.

In a first embodiment of the invention the sealing element is an open frame element, which engages in the grooves of two adjacent structures. In a second embodiment of the invention the sealing element is a closed cover element, which ensures hermetic sealing of each individual substrate (module layer).

BRIEF DESCRIPTION OF THE DRAWING FIGURES

The invention is explained in more detail below using figures, in which

Figure 2:
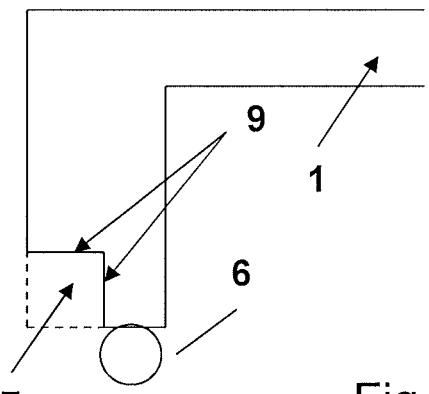
Figure 3:
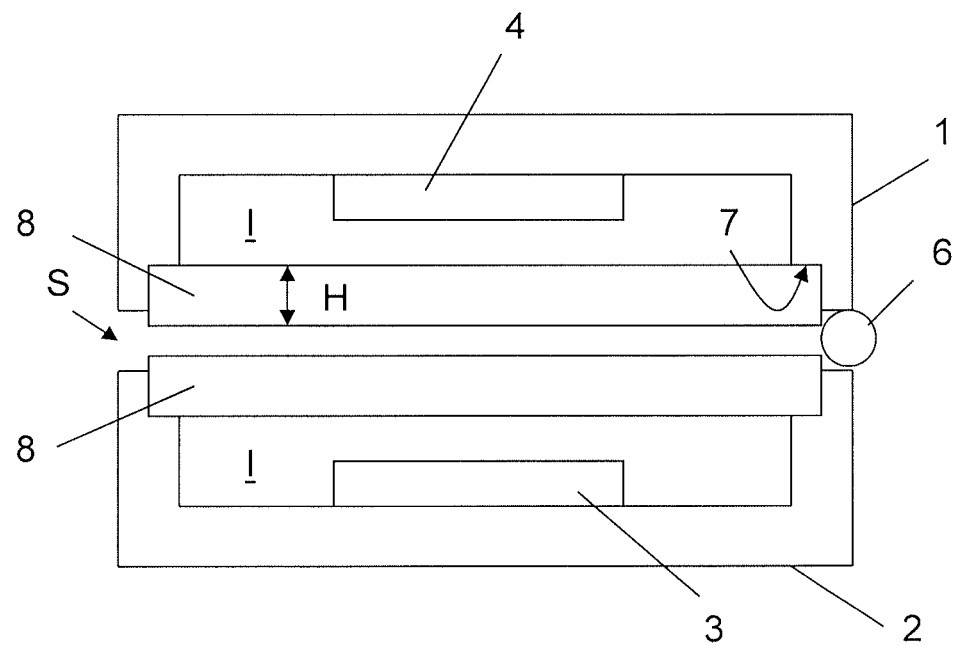

FIG. 1a shows a schematic side view of an HF front end according to the invention in the first embodiment with a groove running in the inner region, FIG. 1b shows an enlarged illustration of the groove from region A in FIG. 1a, FIG. 1c shows a schematic illustration of a frame element according to the invention of the first embodiment, FIG. 2 shows a schematic illustration of an HF front end according to the invention in the first embodiment with a groove running in the outer region, and FIG. 3 shows a schematic side view of an HF front end according to the invention in the second embodiment.

DETAILED DESCRIPTION

A first embodiment of an HF front end according to the invention (e.g. a transmission/reception module) is illustrated in FIG. 1a. It shows two substrates 1, 2 stacked one above the other, each carrying (at least) one component 3, 4, e.g., amplifier, phase shifter, amplitude controller, transmit-receive switch (circulator), control electronics (e.g., application specific integrated circuits (ASIC) or field programmable gate arrays (FPGA)) or antenna element. Each substrate 1, 2 comprises a groove 7 appropriately running along the periphery of a substrate. A frame sealing element 5 (preferably metallic or plastic with external metallization) is introduced into this groove 7 (FIG. 1c). This frame element 5 engages in the grooves 7 of the two adjacent substrates 1, 2. The frame element 5 is suitably soldered or glued into the grooves (see contact areas 9 in FIG. 1b).

The height H of the frame element 5 is appropriately selected so that there is a gap S between the two substrates 1, 2. The height H of the frame element 5 is adapted to the size of the gap S, which results from the melting of the solder balls for making electrical and thermal connection between the adjacent substrates 1, 2. An electrical connection between the solder balls 6 and the frame element 5 is to be avoided, otherwise this could lead to an electrical short circuit and thus failure of the HF front end.

FIG. 1b shows an arrangement with the frame element 5 soldered on the contact areas 9 in the inner region of two module substrates 1, 2. The arrangement implements hermetic sealing for the inner region of the adjacent module layers 1, 2.

FIG. 1a further shows that an open interior space I is formed between the two components 3, 4 of the adjacent substrates 1, 2 with the frame element 5 used. The solder balls 6 are located in the outer region and are thus advantageously accessible for electrical measurements (e.g., after preparing the modules for testing the electrical function of the individual module layers). The possibility of fouling in this connection region is disadvantageous for this arrangement and could lead to degradation of the electrical operation or failure. This can be prevented by suitable environmental technology constraints (e.g., air filters).

FIG. 2 shows a section of an HF front end according to the invention corresponding to region A in FIG. 1a, with the difference that the groove 7 runs in the outer region of the substrates 1, 2, i.e., facing away from the inner region I. The frame element 5 is then soldered to the illustrated contact areas 9 in the outer region of two module substrates 1, 2. This arrangement provides hermetic sealing for the inner region I of the adjacent substrates 1, 2 (module layers). The solder balls 6 are located in the protected inner region and are thus not accessible for subsequent electrical measurements. The complete module design and the integrated components are advantageous, since full hermetic sealing is provided. Additional environmental constraints are not necessary.

A second embodiment of an HF front end according to the invention is illustrated in FIG. 3. The same components are respectively given the same reference numbers as in FIG. 1. The embodiment in FIG. 3 differs from the embodiments shown in FIG. 1 and FIG. 2 in that an open frame element is not used, but instead a closed cover element 8 (e.g. a metallic cover) is used.

The cover element 8 is essentially characterized in that the respective interior space of a module substrate is closed separately and is thus hermetically sealed. In addition, the adjacent interior space I of the adjacent substrates 1, 2 are separated from each other, and hence the electromagnetic coupling of the components on the various module substrates is prevented. The cover elements 8 can be, for example, thin metal strips, which can be soldered into the grooves 7 of the substrates 1, 2 using conventional manufacturing methods (e.g. soldering or gluing to the contact areas 9). The second embodiment of the invention provides further advantages in addition to the hermetic sealing of the individual substrates, such as, for example:

preliminary electrical tests with the closed substrates before the electrical connection of the individual substrates using the solder balls, repair options by replacing individual substrates following unsoldering of the solder balls, simple modernization of the individual substrates by replacing these substrates with improved integrated components, e.g. circuits occurring as a result of new technologies within the integrated components, modular antenna structures through the combination of standardized and application-dependent module substrates.

modular module structure, which enables transmission/reception modules, transmission modules or reception modules by combining suitable module substrates. In addition, the topmost module substrate with integrated radiating element can be integrated in the overall module or omitted depending on the application.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. An HF front end in a multilayer structure comprising: electronic components;
a plurality of substrates stacked one above the other and carrying the components, wherein an interior space is formed between the stacked plurality of substrates; and
sealing elements arranged between the plurality of substrates to hermetically seal the entire multilayer structure and the interior space from an environment surrounding an exterior of the multilayer structure,
wherein the substrates include grooves and the sealing elements are arranged to engage in the grooves of adjacent substrates and adjacent substrates are soldered together,
wherein each of the substrates includes first, second, and third exterior sides, wherein the first exterior side includes first and second ends, and wherein second and third exterior sides respectively extend perpendicularly from first and second ends of the first exterior side,
wherein the second and third exterior sides each have a first end adjoining the first exterior side and a second end opposite of the first end adjoining the first exterior side, and wherein the grooves are formed in the second end of the second and third exterior sides,
wherein each of the grooves has a first side formed in a first direction in the substrate and a second side formed in a second direction in the substrate, wherein the first and second directions are perpendicular to each other,
wherein the grooves open into the interior space.

2. The HF front end as claimed in claim 1, wherein a height of the sealing elements is selected so that there is a gap between the substrates, which is formed for the introduction of solder, wherein solder balls are arranged in the gap.

3. The HF front end as claimed in claim 1, wherein the grooves are formed circumferentially in the plurality of substrates.

4. The HF front end as claimed in claim 1, wherein the sealing elements are soldered or glued into the grooves.

5. The HF front end as claimed in claim 1, wherein one of the sealing elements is an open frame element that engages in the grooves of each adjacent substrate, or one of the sealing elements is a metallic cover that engages in the groove of the respective substrate.

6. The HF front end as claimed in claim 1, wherein one of the sealing elements is a closed cover element.

7. The HF front end as claimed in claim 1, wherein each of the sealing elements includes a first side facing toward the interior space and a second side, opposite of the first side, facing toward the environment, wherein a top and bottom portion of each of the sealing elements facing the environment is obscured by the substrate.

8. The HF front end as claimed in claim 1, further comprising:
solder balls arranged between the stacked plurality of substrates, wherein the solder balls are arranged between the sealing elements and the environment.

9. The HF front end as claimed in claim 1, wherein the grooves are arranged in a circumferential portion of each of the plurality of substrates, and wherein the sealing elements engage in the grooves so that a single interior space is formed between the stacked plurality of substrates.

10. The HF front end as claimed in claim 1, wherein the grooves are arranged in a circumferential portion of each of the plurality of substrates, wherein the sealing elements engage in the grooves so that two interior spaces are formed between the stacked plurality of substrates, wherein the two interior spaces are hermetically sealed from each other by the sealing elements.

11. An HF front end in a multilayer structure comprising:
electronic components;
a plurality of substrates stacked one above the other and carrying the components, wherein an interior space is formed between the stacked plurality of substrates; and
sealing elements arranged between the plurality of substrates to hermetically seal the entire multilayer structure and the interior space from an environment surrounding an exterior of the multilayer structure,
wherein the substrates include grooves and the sealing elements are arranged to engage in the grooves of adjacent substrates and adjacent substrates are soldered together,
wherein each of the substrates includes first, second, and third exterior sides, wherein the first exterior side includes first and second ends, and wherein second and third exterior sides respectively extend perpendicularly from first and second ends of the first exterior side,
wherein the second and third exterior sides each have a first end adjoining the first exterior side and a second end opposite of the first end adjoining the first exterior side, and wherein the grooves are formed in the second end of the second and third exterior sides,
wherein each of the grooves has a first side formed in a first direction in the substrate and a second side formed in a second direction in the substrate, wherein the first and second directions are perpendicular to each other,
wherein the grooves open into the environment.

12. The HF front end as claimed in claim 11, wherein each of the sealing elements includes a first side facing toward the interior space and a second side, opposite of the first side, facing toward the environment, wherein the entire side of each of the sealing elements facing the environment is unobscured by the substrate.

13. The HF front end as claimed in claim 11, further comprising:
solder balls arranged between the stacked plurality of substrates, wherein the solder balls are arranged between the sealing elements and the interior space.

14. The HF front end as claimed in claim 11, wherein a height of the sealing elements is selected so that there is a gap between the substrates, which is formed for the introduction of solder, wherein solder balls are arranged in the gap.

15. The HF front end as claimed in claim 11, wherein the grooves are formed circumferentially in the plurality of substrates.

16. The HF front end as claimed in claim 11, wherein the sealing elements are soldered or glued into the grooves.

17. The HF front end as claimed in claim 11, wherein one of the sealing elements is an open frame element that engages in the grooves of each adjacent substrate, or one of the sealing elements is a metallic cover that engages in the groove of the respective substrate.

18. The HF front end as claimed in claim 11, wherein one of the sealing elements is a closed cover element.

19. The HF front end as claimed in claim 11, wherein the grooves are arranged in a circumferential portion of each of the plurality of substrates, and wherein the sealing elements engage in the grooves so that a single interior space is formed between the stacked plurality of substrates.

* * * * *